United States Patent
Jung et al.

(10) Patent No.: US 10,847,324 B2
(45) Date of Patent: Nov. 24, 2020

(54) METHOD FOR RECYCLING PEROVSKITE-BASED PHOTOELECTRIC CONVERSION ELEMENT

(71) Applicants: GLOBAL FRONTIER CENTER FOR MULTISCALE ENERGY SYSTEMS, Seoul (KR); RESEARCH & BUSINESS FOUNDATION SUNGKYUNKWAN UNIVERSITY, Gyeonggi-do (KR)

(72) Inventors: Hyun Suk Jung, Seoul (KR); Byeong Jo Kim, Incheon (KR); Dong Hoe Kim, Seoul (KR); Seung Lee Kwon, Gyeonggi-do (KR); Dong Geon Lee, Seoul (KR); Young Un Jin, Gyeonggi-do (KR); So Yeon Park, Gyeonggi-do (KR)

(73) Assignees: GLOBAL FRONTIER CENTER FOR MULTISCALE ENERGY, Seoul (KR); RESEARCH & BUSINESS FOUNDATION SUNGYUNKWAN, Gyeonggi-do (KR)

( * ) Notice: Subject to any disclaimer, the term of this patent is extended or adjusted under 35 U.S.C. 154(b) by 0 days.

(21) Appl. No.: 15/771,160

(22) PCT Filed: Oct. 24, 2016

(86) PCT No.: PCT/KR2016/011983
§ 371 (c)(1),
(2) Date: Apr. 27, 2018

(87) PCT Pub. No.: WO2017/073974
PCT Pub. Date: May 4, 2017

(65) Prior Publication Data
US 2018/0308642 A1    Oct. 25, 2018

(30) Foreign Application Priority Data
Oct. 30, 2015 (KR) .................. 10-2015-0152460

(51) Int. Cl.
*C25B 1/00* (2006.01)
*C25B 15/00* (2006.01)
(Continued)

(52) U.S. Cl.
CPC ............ *H01G 9/2059* (2013.01); *B08B 3/08* (2013.01); *H01L 31/0256* (2013.01);
(Continued)

(58) Field of Classification Search
CPC ............ H01L 51/4226; H01L 51/0003; H01L 51/4253; H01L 2251/306; H01L 27/301;
(Continued)

(56) References Cited

U.S. PATENT DOCUMENTS 10,347,432 B2 * 7/2019 Arabpour Roghabadi ................. H01L 51/4226
2012/0258554 A1 * 10/2012 Belle ................. H01L 21/76251 438/4

(Continued)

FOREIGN PATENT DOCUMENTS

JP    2002-280086 A    9/2002
JP    2014-229747 A    12/2014
(Continued)

OTHER PUBLICATIONS

Conings et al., "Perovskite-Based Hybrid Solar Cells Exceeding 10% Efficiency with High Reproducibility Using a Thin Film Sandwich Approach", Advanced Materials, vol. 26, Issue 13, pp. 2041-2046, Apr. 2, 2014.
(Continued)

*Primary Examiner* — Bradley Smith
*Assistant Examiner* — David J Goodwin
(74) *Attorney, Agent, or Firm* — Christensen Fonder Dardi; Diane E. Bennett; Peter S. Dardi

(57) ABSTRACT

The present invention relates to a method which can effectively remove perovskite light absorbers, hole transport
(Continued)

layers, metal electrodes, and the like by immersing a waste perovskite-based photoelectric conversion element module in a cleaning solution under predetermined conditions. The present invention can recover a substrate from the waste module and manufacture a photoelectric conversion element having a photoelectric conversion efficiency level comparable to the initially high level again, using the same.

15 Claims, 10 Drawing Sheets

(51) Int. Cl.
| | |
|---|---|
| *H01L 21/00* | (2006.01) |
| *H01L 21/66* | (2006.01) |
| *G01R 31/26* | (2020.01) |
| *H01G 9/20* | (2006.01) |
| *H01L 31/18* | (2006.01) |
| *H01L 31/0256* | (2006.01) |
| *H01L 51/00* | (2006.01) |
| *H01L 31/032* | (2006.01) |
| *H01L 51/42* | (2006.01) |
| *B08B 3/08* | (2006.01) |
| *H01L 51/44* | (2006.01) |
| *C11D 1/58* | (2006.01) |

(52) U.S. Cl.
CPC .......... *H01L 31/0322* (2013.01); *H01L 31/18* (2013.01); *H01L 31/186* (2013.01); *H01L 51/0003* (2013.01); *H01L 51/4226* (2013.01); *H01L 51/442* (2013.01); *C11D 1/58* (2013.01); *H01G 9/2031* (2013.01); *Y02E 10/549* (2013.01); *Y02P 70/521* (2015.11)

(58) Field of Classification Search
CPC ............ H01L 51/0026; H01L 51/0032; H01G 9/2031
See application file for complete search history.

(56) References Cited

U.S. PATENT DOCUMENTS

| | | | |
|---|---|---|---|
| 2015/0129034 A1 | 5/2015 | Snaith et al. | |
| 2015/0318477 A1* | 11/2015 | Irwin ................. | H01L 51/0003 556/35 |
| 2016/0233439 A1* | 8/2016 | Burschka ............ | H01L 51/0083 |
| 2016/0351841 A1* | 12/2016 | Suzuka ............... | H01L 51/4226 |
| 2017/0018371 A1* | 1/2017 | Suzuka ............... | H01L 51/0003 |
| 2018/0179650 A1* | 6/2018 | Poll .......................... | C25C 1/18 |
| 2018/0269004 A1* | 9/2018 | Arabpour Roghabadi .................. | H01L 51/4226 |

FOREIGN PATENT DOCUMENTS

| | | |
|---|---|---|
| JP | 2015-046585 A | 3/2015 |
| JP | 2015-069824 A | 4/2015 |
| KR | 10-2011-0031688 A | 3/2011 |
| KR | 10-1544317 B1 | 8/2015 |
| KR | 10-1557587 B1 | 10/2015 |

OTHER PUBLICATIONS

Miller et al., "Dipolar Aprotic Solvents in Bimolecular Aromatic Nucleophilic Substitution Reactions1", Journal of the American Chemical Society, vol. 83:1, pp. 117-123, Jan. 1961.
International Search Report for Application No. PCT/KR2016/0011983 dated Feb. 22, 2017.
Japanese Office Action from copending Japanese Patent Application No. 2018-522529 dated Jun. 3, 2019. (no translation).

\* cited by examiner

| DMF | $J_{sc}$ (mA/cm$^2$) | $V_{oc}$ (V) | FF | PCE (%) |
|---|---|---|---|---|
| After | 17.08 | 1.04 | 0.68 | 12.06 |
| Before | 17.11 | 1.02 | 0.66 | 11.44 |

METHOD FOR RECYCLING PEROVSKITE-BASED PHOTOELECTRIC CONVERSION ELEMENT

BACKGROUND OF THE INVENTION

Field of the Invention

This application is a National Stage filing of PCT Application No. PCT/KR2016/011983 filed Oct. 24, 2016, entitled "Method for Recycling Perovskite-Based Photoelectric Conversion Element", which claims the benefit of priority to Korean Patent Application No. 10-2015-0152460, filed on Oct. 30, 2015, the entire disclosure of both are incorporated herein by reference.

The present invention relates to a method of recycling a photoelectric conversion element including a perovskite light absorbing layer.

Description of the Related Art

In general, photoelectric conversion materials are light absorbers that absorb light energy and convert it into electric energy. Solar cell, a typical element comprising photoelectric conversion material, is a tool for producing electricity using sunlight which is a limitless energy source, and is already widely used in our daily life. Silicon material used in silicon solar cells is a typical photoelectric conversion material. Recently, researches on organic-inorganic composite perovskite elements employing a light absorber having a perovskite structure have been actively conducted.

In particular, a solar cell using a perovskite light absorber has attracted attention as a next generation solar cell because of a lower process cost in comparison with other solar cells such as silicon solar cells and organic solar cells in addition to excellent photoelectric conversion efficiency.

However, in the case of perovskite solar cells, if the performance of the solar cells has deteriorated and its life has ended, the substrate is discarded. In this process, the substrate-constituting materials including electron collectors such as $TiO_2$ and transparent electrodes such as FTO are discarded, thereby causing economic losses. In addition, since it contains harmful substances such as Pb, which is mainly used for the metal element (M) in AMX3 structure, an additional cost is required to dispose of it.

Therefore, in order to commercially use a photoelectric conversion element comprising a perovskite light absorber, it is necessary to reduce the unit cost by recycling the materials used in the element and to reduce the cost incurred in collecting and disposing of harmful substances such as Pb.

SUMMARY OF THE INVENTION

Accordingly, an object of the present invention is to provide a method of recovering and recycling a substrate from a perovskite photoelectric conversion element whose life has ended or which has already been used.

The present invention also provides a photoelectric conversion element having excellent efficiency in spite of being manufactured by recycling a substrate of a perovskite photoelectric conversion element whose life has ended.

The problems to be solved by the present invention are not limited to the above-mentioned problems, and other matters not mentioned can be clearly understood by those skilled in the art from the following description.

The present invention provides a method of recycling a waste module of a perovskite photoelectric conversion element comprising a step of immersing a waste module of a perovskite photoelectric conversion element in a washing solvent for a period of time satisfying the following Equation 1:

$$y = a1 x_1^{-b1} \qquad [\text{Equation 1}]$$

wherein y is the immersion time (min), $x_1$ is a dipole moment of the washing solvent, $a_1$ is a constant of 700 to 850, and b1 is a constant of 4 to 6.

In one embodiment, the dipole moment of the washing solvent may be 1.5 or more.

In addition, the immersion time may satisfy the following Equation 2 in relation to the pH (x2) of the washing solvent.

$$y = c e^{dx2} \qquad [\text{Equation 2}]$$

wherein y is the immersion time (min), x2 is a pH of the washing solvent, c is a constant of 40 to 50, and d is a constant of about 0.3 to 0.9.

In addition, the photoelectric conversion element may have a light absorbing layer containing an organometallic halide, and the washing solvent may be $S_N2$-reactive with the organometallic halide.

In one embodiment, the perovskite photoelectric conversion element may have a structure in which a transparent electrode layer, a hole blocking layer, an electron collecting layer, a light absorbing layer, a hole transporting layer and a metal electrode layer are sequentially formed on a transparent substrate.

In one embodiment, the light absorbing layer, the hole transporting layer, the metal electrode layer, or a combination thereof may be removed by immersing the waste module in the washing solution, and the substrate having the transparent electrode layer and the electron collecting layer may be collected.

In one embodiment, the method may further include a step of forming a light absorbing layer, a hole transporting layer, a metal electrode layer, or a combination thereof on the recovered substrate.

There is also provided a perovskite photoelectric conversion element recycled by the above method.

Effect of the Invention

In a conventional method, a perovskite photoelectric conversion element whose lifetime has expired is discarded as a module. According to the present invention, perovskite light absorbers, hole transporting layers, metal electrodes, and the like are removed from modules of waste photoelectric conversion elements and substrates are recovered and can be used to reproduce a photoelectric conversion element having an initial high photoelectric conversion efficiency, thereby reducing the production cost.

DETAILED DESCRIPTION OF THE INVENTION

Figure 1:
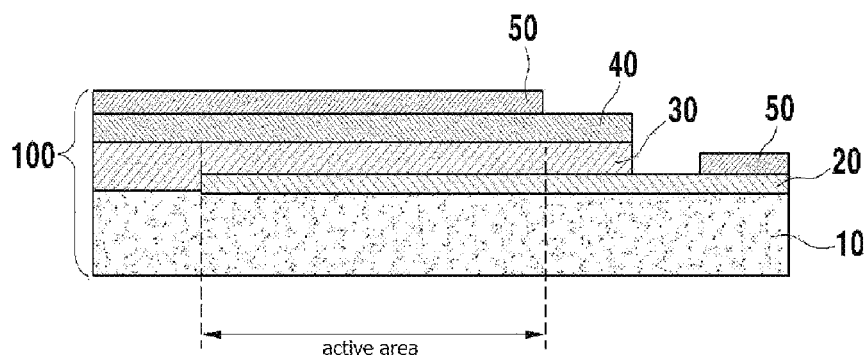
FIG. 1 is a schematic view illustrating a general structure of a perovskite solar cell.

Hereinafter, the present invention will be described in detail with reference to the accompanying drawings so that those skilled in the art can easily carry out the present invention. The present invention may, however, be embodied in various different forms and should not be construed as limited to the embodiments set forth herein.

In the drawings, in order to clearly explain the present invention, the parts not related to the explanation are omitted, and similar parts are given the same reference numerals throughout the specification.

Throughout the present disclosure, when a part is referred to as being "connected" to another part, it is not limited to a case where it is "directly connected" thereto but also includes a case where it is "electrically connected" thereto with an arbitrary element interposed there between.

Throughout the present disclosure, when an element is located "on" another member, this includes not only a case where a member is in contact with another member, but also a case where there is any other member between the two members.

Throughout the present disclosure, when a section "includes" a constitutional element, it is to be understood that, unless specifically stated to the contrary, this does not exclude other constitutional elements but may further comprise other constitutional elements. The terms "about", "substantially", etc. used throughout the present disclosure intend to encompass the numerical values close to their respective values, taking into account the inherent engineering and material tolerances, and they are used to prevent unauthorized intruders from improperly exploiting the exact or absolute numbers listed to help understand the present disclosure. The terms "a step . . . ing" and "a step of . . . " do not mean "a step for . . . ".

Throughout the present disclosure, the expression "combination thereof" in Markush structure means mixtures or combinations of one or more selected from the group consisting of elements mentioned in the Markush structure, or is construed to include at least one selected from the group consisting of the above elements.

Throughout the present disclosure, the expression "A and/or B" means "A; or B; or A and B"

Throughout the present disclosure, the term "module" refers to a structure having a perovskite light absorbing layer between at least a first electrode and a second electrode, and the term "waste module" refers to a used module whose life has almost ended and which cannot be used anymore.

The term "substrate" refers to a structure in which at least a conductive layer is formed on a rigid or flexible substrate, and further, a hole blocking layer, an electron collecting layer, or both may be formed thereon. This does not include a metal electrode layer or a light absorbing layer.

Hereinafter, embodiments and examples of the present invention will be described in detail with reference to the accompanying drawings. However, the present invention may not be limited to these embodiments and examples and drawings.

FIG. 1 shows a structure of a solar cell which is one of representative photoelectric conversion elements.

Referring to FIG. 1, the dye-sensitized solar cell 100 may have a sandwich structure in which two electrodes, that is, the first electrode 20 and the second electrode 50 are surface-bonded, but not limited thereto. For example, the first electrode 20 may be expressed as a working electrode or a semiconductor electrode, but not limited thereto. The first electrode 20 may be formed on the transparent substrate 10. The light absorbing layer 30 may be formed on the first electrode 20 and the organometallic halide perovskite may be included in the light absorbing layer 30 to excite electrons due to absorption of visible light. A hole transport material 40 may be formed on the light absorption layer 30 and a second electrode 50 may be formed on the hole transporting layer 40. The hole transporting layer 40 may be formed to reduce the oxidized light absorbing layer 30, but not limited thereto. In addition, the hole transporting layer 40 may not necessarily be formed in a single plane on the light absorption layer 30. For example, the operation principle of the perovskite solar cell will be explained. When solar light is incident, the photon beam is first absorbed by the perovskite in the light absorbing layer 30, so that the perovskite electronically transition from a ground state to an excited state to form an electron-hole pair, and the electrons in the excited state can be injected into the conduction band at the interface of the semiconductor fine particles. The injected electrons are transferred to the first electrode 20 through the interface and then to the second electrode 50 which is a counter electrode opposed to the first electrode 20 through an external circuit. On the other hand, the perovskite oxidized as a result of the electron transition is reduced by the redox couple ions in the hole transporting layer 40, and the oxidized ions may cause a reduction reaction with electrons reaching the interface of the second electrode 50 to achieve charge neutrality, so that the solar cell can operate.

In one embodiment, the first electrode 20 is also referred to as a transparent electrode, and may comprise any material(s) selected from the group consisting of indium tin oxide (ITO), fluorine tin oxide (FTO), $ZnO-Ga_2O_3$, $ZnO-Al_2O_3$, tin oxide, zinc oxide, and any combinations thereof, but may not be limited thereto. The transparent electrode may be formed of any material having conductivity and transparency without particular limitation, for example, any material selected from the group consisting of indium tin oxide (ITO), fluorine tin oxide (FTO), $ZnO-Ga_2O_3$, $ZnO-Al_2O_3$, tin oxide, zinc oxide, and any combinations thereof.

The transparent substrate 10 may be a glass substrate or a plastic substrate. The plastic substrate is made of polyethylene terephthalate (PET), polyethylene naphthalate (PEN), polycarbonate (PC), polypropylene (PP), polyimide: PI), triacetyl cellulose (TAC), and any combinations thereof, but are not limited thereto.

As a method for forming the transparent electrode 20 on one surface of the transparent substrate 10, a physical vapor deposition (PVD) method such as electrolytic plating, sputtering, or electron beam evaporation may be used, but not limited thereto.

The light absorbing layer 30 contains an organometallic halide perovskite represented by the following Formula 1 as a light absorber.

$$AMX_3 \qquad \text{[Formula 1]}$$

wherein A is a C1-20 alkyl group, C1-20 alkyl substituted by an amine group, or an alkali metal or alkaline earth metal, M is any selected from the group consisting of a transition metal (e.g., Pb, Sn, Ti, Nb, Zr, Ce), a post-transition metal and any combinations thereof, and X is a halogen atom.

Figure 2:
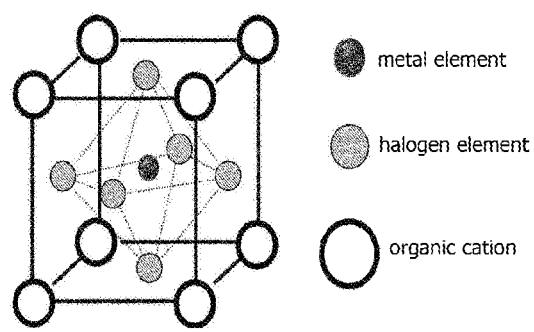
FIG. 2 schematically shows an organometallic halide perovskite structure.

For example, the perovskite represented by Formula 1 may have a structure as shown in FIG. 2 and may be manufactured from $MX_2$ and AX, but not limited thereto.

The perovskite represented by the formula 1 is an organic-inorganic composite material having an AMX3 structure, and in formula 1, R is C1-20 alkyl group, C1-20 alkyl substituted by an amine group, an alkali metal such as Li, Na, K, Rb, Cs or Fs, or an alkaline earth metal, M is a transition metal such as Pb, Sn, Ti, Nb, Zr or Ce, a post-transition metal, or any combinations thereof, and X is a halogen. The alkyl group may have a carbon number of 1 to 20, but may not be limited thereto. For example, the number of carbon atoms may be from about 1 to about 20, from about 1 to about 10, from about 1 to about 6, from about 6 to about 20, from about 6 to about 10, or from about 10 to about 20, but may not be limited thereto. The halogen may be, but not limited to, F, Br, Cl or I. The dye represented by Formula 1 may be, but not limited to, $CH_3NH_3PbI_3$. The dyes represented by the formula (1) have a higher extinction coefficient than that of common organic dyes in exponential units, and thus exhibit very good light harvesting even in thin films. Accordingly, when the dye represented by Formula 1 is used, a high energy conversion efficiency can be achieved even if the dye-sensitized solar cell has a thin light absorbing layer, but not limited thereto.

In one embodiment, the hole transporting layer 40 may include, but not limited thereto, a hole transporting molecular material or a hole transporting polymer material. For example, a hole transporting molecular material may be an inorganic substance such as NiO or CuSCN or spiro-MeO-TAD [2,2',7,7'-tetrakis-(N,N-di-p-methoxyphenyl-amine)-9,9'-spirobifluorene], and a hole transporting polymer material may be P3HT [poly (3-hexylthiophene)], but they may not be limited thereto. In addition, for example, the hole transporting layer may additionally include, but not limited thereto, a Li dopant, a Co dopant, or a combination thereof as a doping material. Further, for example, the hole transporting layer may additionally include additives such as tBP, but not limited thereto. For example, a mixture of spiro-MeOTAD, tBP, and Li-TFSI may be used as the material constituting the hole transporting layer, but not limited thereto. For example, when a hole transporting material of p-type is used, hole mobility is about $10^4$ times larger than spiro-MeOTAD, and thus efficient hole transporting can be performed even in a thick film, but not limited thereto.

On the other hand, since the hole transporting material included in the hole transporting layer 40 has a short hole transporting property, it is difficult to apply the hole transporting material when the thickness of the light absorbing layer included in the solar cell is large. Meanwhile, when the thickness of the light absorbing layer including a conventional ruthenium metal complex is decreased, the current density is lowered and the energy conversion efficiency cannot be increased. Therefore, it has been difficult to apply the hole transporting material to the hole transporting layer. However, when a perovskite light absorbing layer having a high extinction coefficient is used instead of the ruthenium metal complex, a high current density and a high energy conversion efficiency can be secured even if the perovskite light absorbing layer is thin, and thus there is an advantage of being suitable for the hole transporting layer.

In one embodiment, the second electrode 50 may be formed of any one from a group consisting of Pt, Au, Ni, Cu, Ag, In, Ru, Pd, Rh, Ir, Os, C, a conductive polymer, and any combinations thereof, but may not be limited thereto. As the second electrode, that is, the counter electrode, a conductive metal material may be used without particular limitation. And, an insulating material may be also used without particular limitation, as long as the conductive layer is formed only in a portion facing the first electrode.

The present invention relates to a method for efficiently recovering a substrate from a waste module of a perovskite-based photoelectric conversion element. The inventors of the present invention have found that there is a difference in the washing ability of a waste module of the perovskite photoelectric conversion element depending on the dipole moment and the pH of the washing solvent, and as a result, the optimum process time could be derived.

Specifically, the present invention relates to a method of recycling a waste module of a perovskite photoelectric conversion element, comprising the step of immersing a waste module of a perovskite photoelectric conversion element in a washing solvent for a period of time satisfying a condition of the following equation 1

$$y = ax_1^{-b} \qquad \text{[Equation 1]}$$

wherein y is the immersion time (min), $x_1$ is a dipole moment of the washing solvent, a is a constant of 700 to 850, and b is a constant of 4 to 6. Preferably, a may be a constant of 750 to 800 and b may be a constant of 4.5 to 5.5

In addition, the immersion time may satisfy the following Equation 2 in relation to the pH ($x_2$) of the washing solvent.

$$y = ce^{dx_2} \qquad \text{[Equation 2]}$$

wherein y is the immersion time (min), $x_2$ is the pH of the washing solvent, c is a constant of 40 to 50, and d is a constant of about 0.3 to 0.9.

Preferably, c is a constant of 40 to 45 and d may be a constant of 0.4 to 0.8.

In addition, the photoelectric conversion element may have a light absorbing layer containing an organometallic halide as described above, and the washing solvent may be $S_N2$-reactive with the organometallic halide.

In one embodiment, the dipole moment of the washing solvent may be at least 1.5.

The $S_N2$ reaction principle of the washing solvent in the process according to the present invention is as follows.

A solvent with a large dipole moment may have a partial positive charge ($\delta^+$) And a partial negative charge ($\delta^-$) as below.

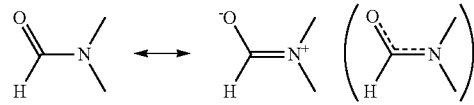

Thus, if the washing solvent contacts the perovskite, the cation component of perovskite is not free due to being surrounded by the partial negative charge (δ⁻) of the washing solvent.

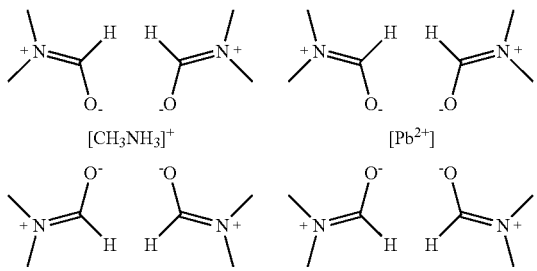

The halogen component of the perovskite can be liberated without binding to the partial positive charge (δ⁺) of the washing solvent by the steric hindrance of the washing solvent.

toelectric conversion element have short electron movement distance, the generated electrons cannot reach the transparent electrode and recombination occurs. As for the material of the electron collecting layer 66, the conduction band should be lower than the conduction band of the perovskite photoelectric conversion element so that electrons can move, and metal oxides (ceramic materials) such as $TiO_2$ or ZnO, or a conductive polymer such as PCBM may be used. The electron collecting layer having a high porosity is advantageous in that it can easily increase the electron collecting layer/perovskite contact area for easily collecting electrons, and a transparent electron collecting layer is advantageous for transmitting sufficient light to the light absorbing layer.

The hole blocking layer 70 is basically used to prevent a short-circuit from occurring due to direct contact of the valence band of the light absorbing layer, the hole transporting layer or the second electrode with the transparent electrode. In addition, it prevents electrons passing through the transparent electrode from recombining with holes. It is effective that the thin film of hole blocking layer densely

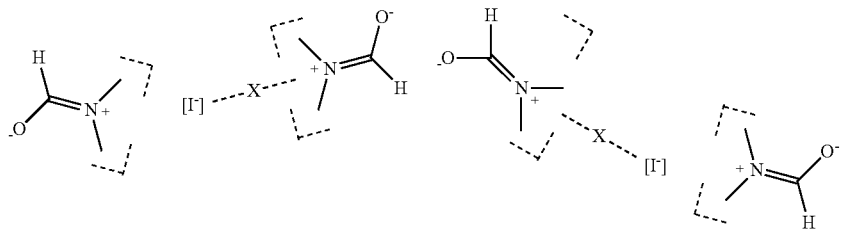

As a result, the $S_N2$ reaction of the perovskite washing solvent is facilitated and the halogen atom (X) can be easily removed as shown below.

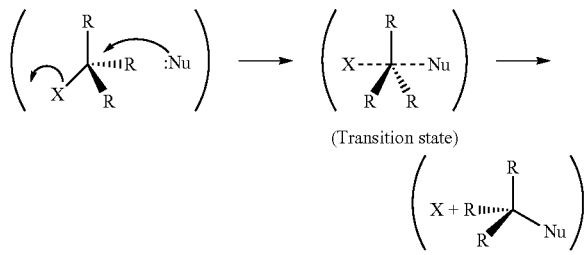

(Transition state)

Figure 3:
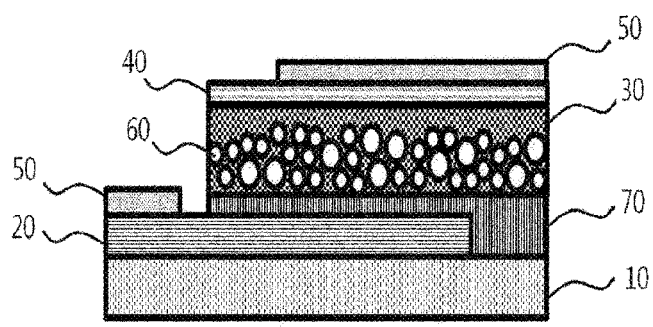
FIGS. 3 and 4 are respectively a cross-sectional view and a plan view showing the structure of a perovskite solar cell according to one embodiment.
Figure 4:
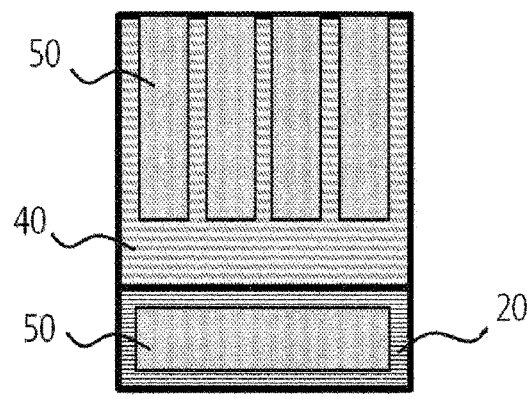

FIG. 3 schematically shows a cross section of the structure of a perovskite solar cell, which is a typical perovskite photoelectric conversion element. FIG. 4 is a plan view of the perovskite solar cell shown in FIG. 3. The solar cell includes a transparent substrate 10, a transparent electrode 20, a light absorbing layer 30, a hole transporting layer 40, and a metal electrode 50. An electron collecting layer 60 and a hole blocking layer 70 are formed between the transparent electrode 20 and the light absorbing layer 30.

The electron collecting layer 60 is for efficiently receiving electrons excited by the perovskite light absorbing layer and moving the electrons to the transparent electrode, and is used for the purpose of transferring electrons to the transparent electrode while reducing the recombination by using a material having a relatively long electron movement distance. This is to reduce the phenomenon that since electrons generated by the light absorbing layer in the general phocovers the transparent electrode so as not to inhibit the generated electrons from moving to the transparent electrode. Typically, $TiO_2$ or ZnO is used.

According to an embodiment of the present invention, a substrate having a transparent electrode layer and a electron collecting layer can be recovered by immersing a waste module in a washing solution under predetermined conditions, thereby removing a light absorbing layer, a hole transporting layer, a metal electrode layer or a combination thereof.

Figure 5:
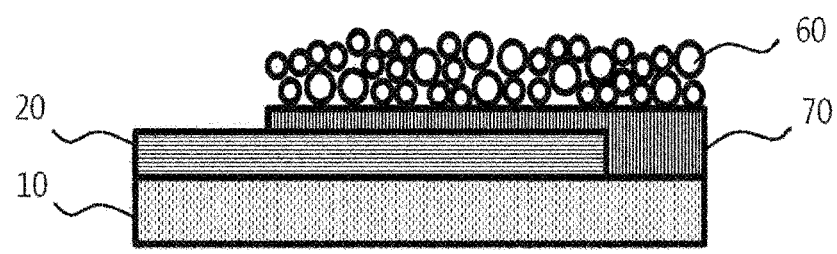
FIGS. 5 and 6 are respectively a cross-sectional view and a plan view showing the structure of a solar cell after washing according to the present invention.
Figure 6:
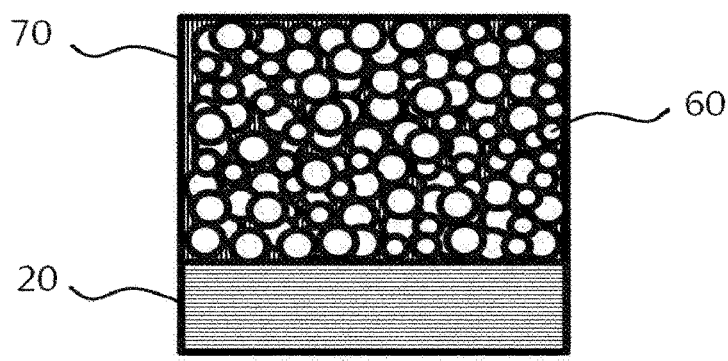

FIGS. 5 and 6 are respectively schematic cross-sectional and plan views of the post-washing module. In comparison with FIGS. 3 and 4, after washing, the light absorbing layer 30, the hole transporting layer 40 and the metal electrode layer 50 are removed and the transparent electrode layer 20, the hole blocking layer 70 and the electron collecting layer 60 only remain on the substrate.

During the washing process, it may be more effective to apply physical stimulation such as shaking or sonication, but not limited thereto.

The washed substrate may be rinsed with distilled water or ethanol and then dried.

The rinsing process or the drying process can be applied without limitation as long as it is commonly used in the related industry, and a detailed description thereof will be omitted.

The substrate thus recovered may be regenerated as a photoelectric conversion element through a process of forming a light absorbing layer, a hole transporting layer, a metal electrode layer, or a combination thereof in a subsequent process.

According to the research results of the present inventors, it has been confirmed that the efficiency (PCE) of the regenerated solar cell is increased up to about 12%.

Hereinafter, embodiments of the present invention will be described in detail. However, the following examples are only illustrative of the present invention and the scope of the present invention is not limited thereto.

Preparation Example—Preparation of Perovskite Solar Cell (1) Manufacture of Transparent Conductive Substrate with Hole Blocking Layer FTO glass (Pilkington, TEC-8, 8 Ω/sq) was ultrasonically washed in acetone, ethanol and distilled water for 20 minutes each. Thereafter, the FTO substrate was spin-coated using a 0.3 M Ti(IV)bis(ethylacetoacetate)-diisopropoxide (Aldrich)/1-butanol (Aldrich) solution, and a transparent conductive substrate including a hole blocking layer was prepared through a heat treatment process at 500° C. for 30 minutes.

(2) Formation of Electron Collecting Layer

A porous titanium dioxide (TiO$_2$) paste having a 20 nm pore size (18 NRT manufactured by Dyesol) was diluted with anhydrous ethanol (5.5:1=ethanol:TiO$_2$ paste, weight ratio) and coated on the hole blocking layer, and then heat-treated at 500° C. for 1 hour to form an electron collecting layer.

(3) Formation of Light Absorption Layer

After the electron collecting layer was formed, a 42 wt % solution of CH$_3$NH$_3$I and PbI$_2$ dissolved at a molar ratio of 1:1(CH$_3$NH$_3$I:PbI$_2$) in dimethyformamide (DMF) was spin-coated on the substrate 2, and then heat-treated at 100-120° C. to form a light absorption layer.

(4) Formation of Hole Transporting Layer

A hole transporting solution comprising about 0.17 M of spiro-MeOTAD as a hole transporting material, about 0.198 M of 4-tert-butylpyridine (tBP) and about 64 mM Li-TFSI (Bis(trifluoromethane)sulfonimide lithium salt) was prepared, wherein the Li-TFSI was first dissolved in acetonitrile at a concentration of 0.1977 g/mL and then added to the solution. The prepared hole transporting solution was spin-coated on the light absorbing layer to form a hole transporting layer.

(6) Formation of the Electrode Layer

An electrode layer was formed on the hole transporting layer by using a thermal evaporator to deposit gold of about 30 nm or more (pressure of $10^{-6}$ torr or less)

(7) Preparation of a Waste Module

The manufactured perovskite solar cell was used until the end of its life.

Figure 7:
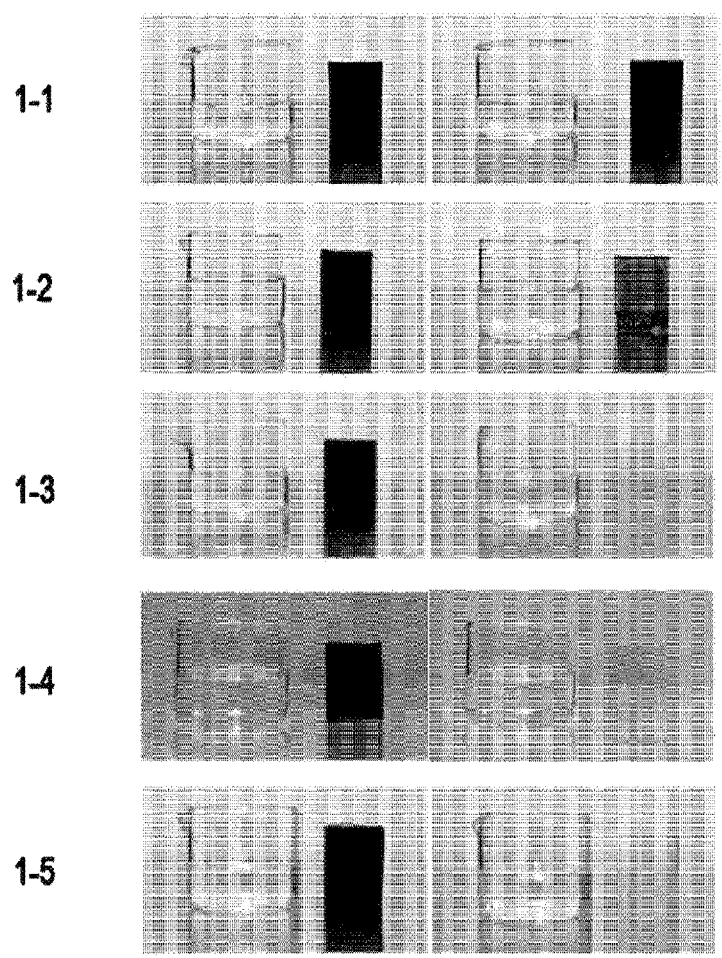
FIGS. 7 and 8 are respectively photographs and a graph showing the experimental procedure and the results according to Test Example 1.

Test Example 1: Determination of Washing Properties According to Dipole Moment of Washing Solvent The solar cell prepared in the preparation example was immersed in the solvent shown in Table 1 at room temperature (25 degrees) and then shaken (150 rpm) to measure the time for completely dissolving the perovskite light absorbing layer, the hole transporting layer and the metal electrode layer. The time point when the perovskite was completely dissolved was determined when the transmittance of the substrate was maintained at 95% or more of the transmittance of the unused substrate. FIG. 7 shows the states before the washing and after the lapse of 20 seconds from the start of the washing

TABLE 1

| Test Example | Solvent | Dipole Moment | Time (min) |
|---|---|---|---|
| 1-1 | 2-propanol | 1.58 | 120.8 |
| 1-2 | methanol | 1.70 | 58 |
| 1-3 | acetone | 2.88 | 1.67 |
| 1-4 | Dimethyl formamide | 3.82 | 1.0 |
| 1-5 | gamma-butyrolactone | 4.27 | 1.17 |

Figure 8:
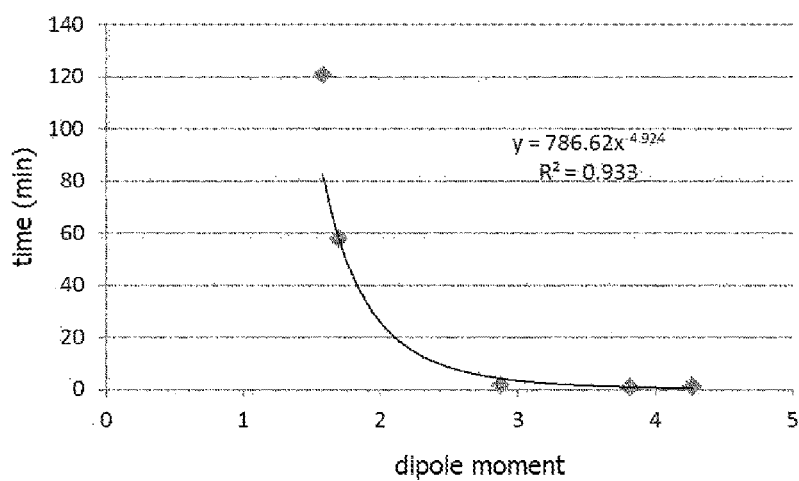

From the results, it can be seen that the dipole moments of the solvent and the washing time satisfy the following relationship (see FIG. 8).

$$y = a1 x_1^{-b1} \quad \text{[Equation 1-1]}$$

wherein y is the immersion time (min), $x_1$ is the dipole moment of the washing solvent, $a_1$ is about 787, and $b_1$ is about 4.9.

Figure 9:
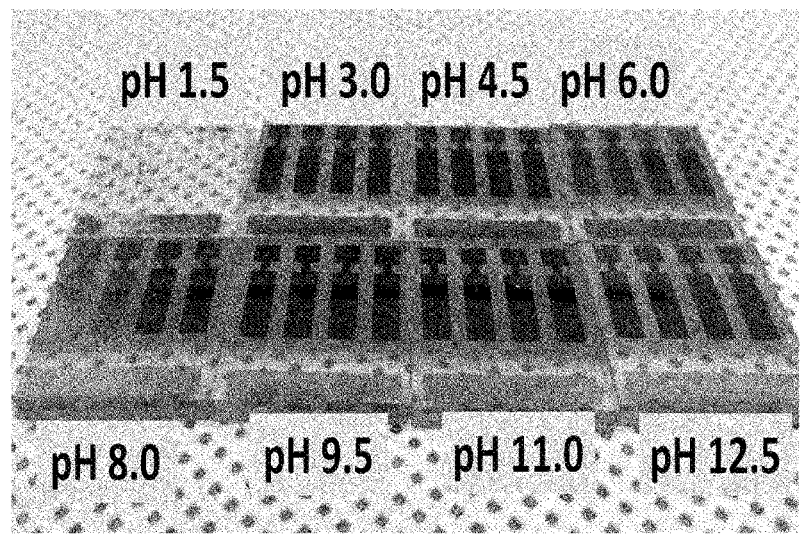
FIGS. 9 and 10 are respectively photographs and a graph showing the experimental procedure and the results according to Test Example 2.

Test Example 2: Determination of Washing Properties According to pH of Washing Solution After the pH of the distilled water (pH 7) was adjusted, washing was carried out under the same conditions as in Test Example 1 to measure the time taken until the perovskite completely dissolved. FIG. 9 is a photograph taken after one hour washing.

TABLE 2

| Test Example | pH | Time (mm) |
|---|---|---|
| 2-1 | 1.5 | 115.5 |
| 2-2 | 3.0 | 265 |
| 2-3 | 4.5 | 417.7 |
| 2-4 | 6.0 | 1850 |
| 2-5 | 8.0 | 4811 |

Figure 10:
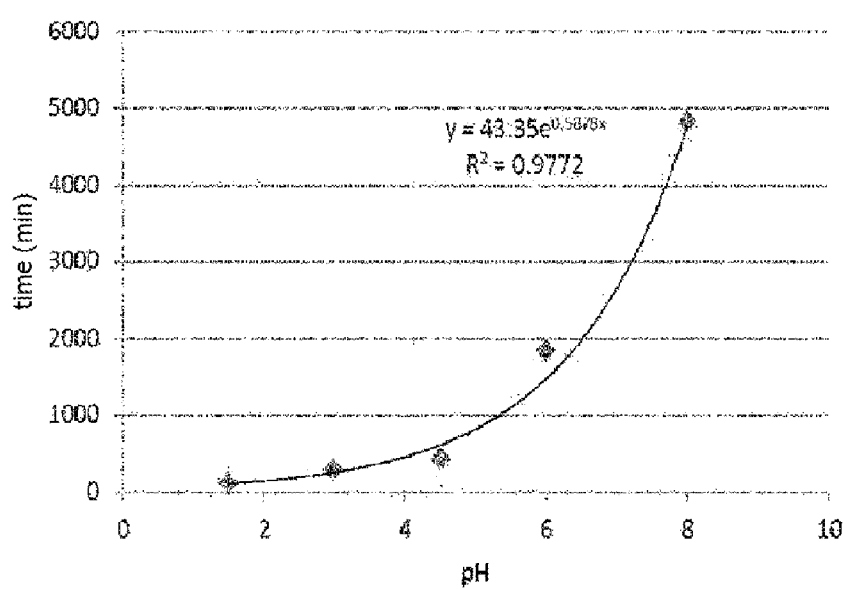

From the above results, it can be seen that the pH of the solvent and the washing time satisfy the relation of the following equation 2 (see FIG. 10).

$$y = c1 e^{d1 x_2} \quad \text{[Equation 2-1]}$$

wherein y is the immersion time (min), $x_2$ is the pH of the washing solvent, c1 is about 43, and d1 is about 0.6.

Examples 1 to 3

Figure 11:
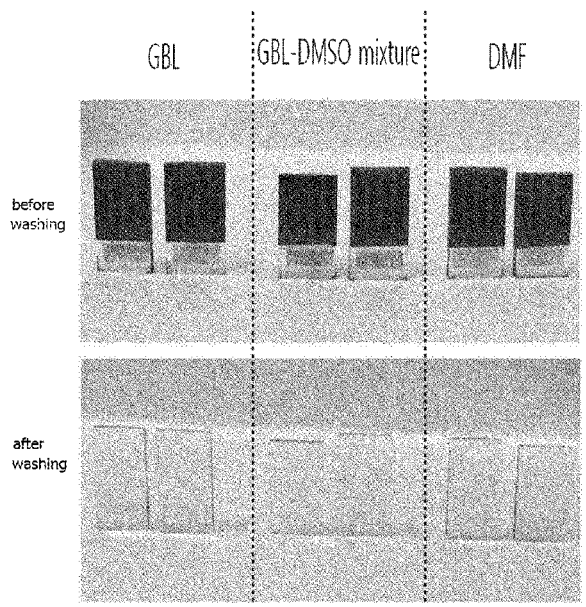
FIG. 11 is photographs of a perovskite solar cell before and after washing according to Examples 1 to 3.

The perovskite solar cell whose life has ended as prepared in the preparation example was immersed in a mixed solution of γ-butyrolactone (GBL), γ-butyrolactone/dimethyl sulfoxide (GBL/DMSO) (volume ratio 7/3) and dimethylformamide (DMF), respectively. The results are shown in FIG. 11 as compared with those before washing.

The washing process was performed by immersing in a vibration condition (150 rpm) until the perovskite light absorbing layer, the hole transporting layer and the metal electrode layer were completely dissolved, rinsing with distilled water, and heating at 100° C. or more for 30 minutes to remove the solution.

Figure 12:
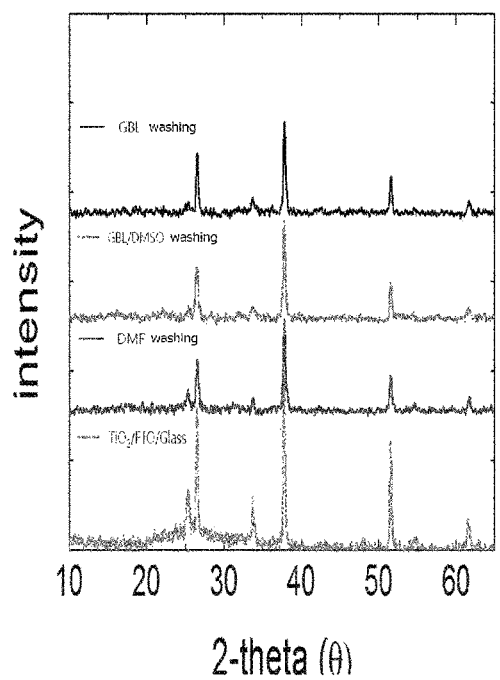
FIG. 12 shows an X-ray diffraction result for analyzing the presence or absence of impurities remaining on the solar cell substrate and the components thereof after washing according to Examples 1 to 3.

X-ray diffraction analysis was carried out to confirm the presence or absence of impurities of the substrate after washing and to identify and components if any, and the results are shown in FIG. 12. It was confirmed that there are almost no impurity peaks.

Figure 13:
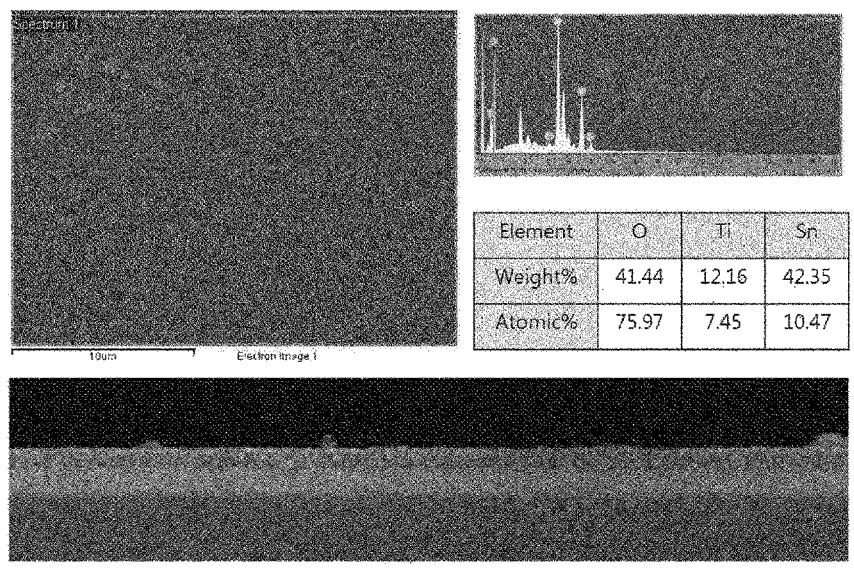
FIG. 13 shows the results of an Energy-dispersive X-ray spectroscopy (EDS) analysis for confirming the presence or absence of impurities remaining on the solar cell substrate and confirming the components thereof after washing according to Example 3.

FIG. 13 shows the result of energy-dispersive X-ray spectroscopy (EDS) analysis for the presence or absence of impurities remaining on the substrate washed with the DMF solution and for identifying the components, if any. It was confirmed that the total of oxygen atoms, titanium atoms and tin atoms is 95.95% by weight and 93.39% by atom and almost no impurities are present.

Example 4—Preparation of Regenerative Solar Cell and Performance Test

Figure 14:
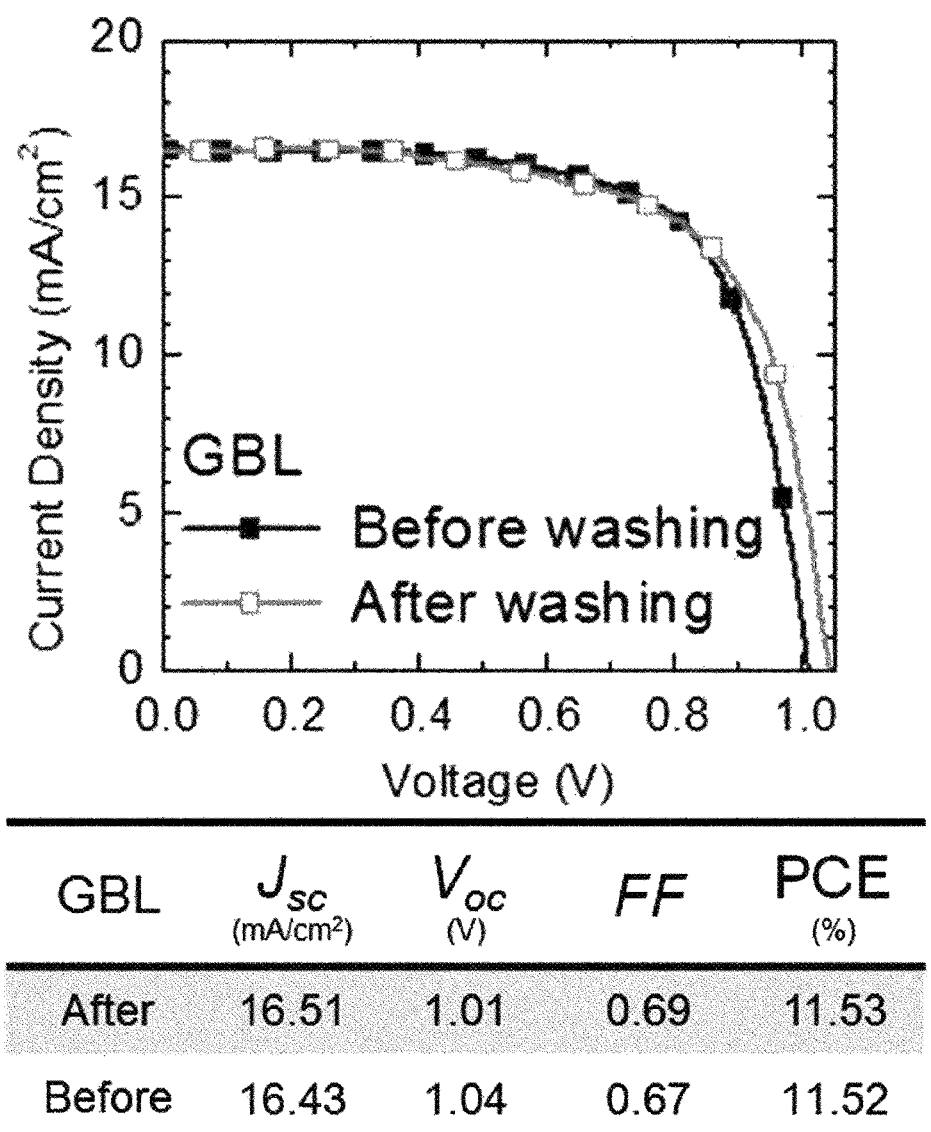
FIGS. 14 to 16 respectively show the current density-voltage curve and the photoelectric conversion efficiency of the solar cell manufactured in Example 4.
Figure 15:
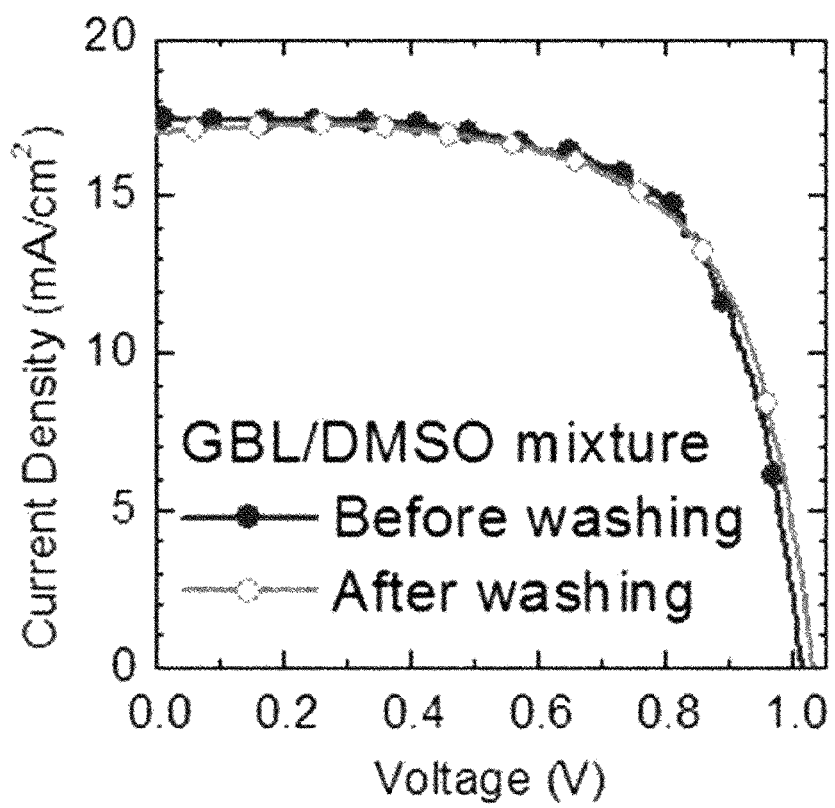
Figure 16:
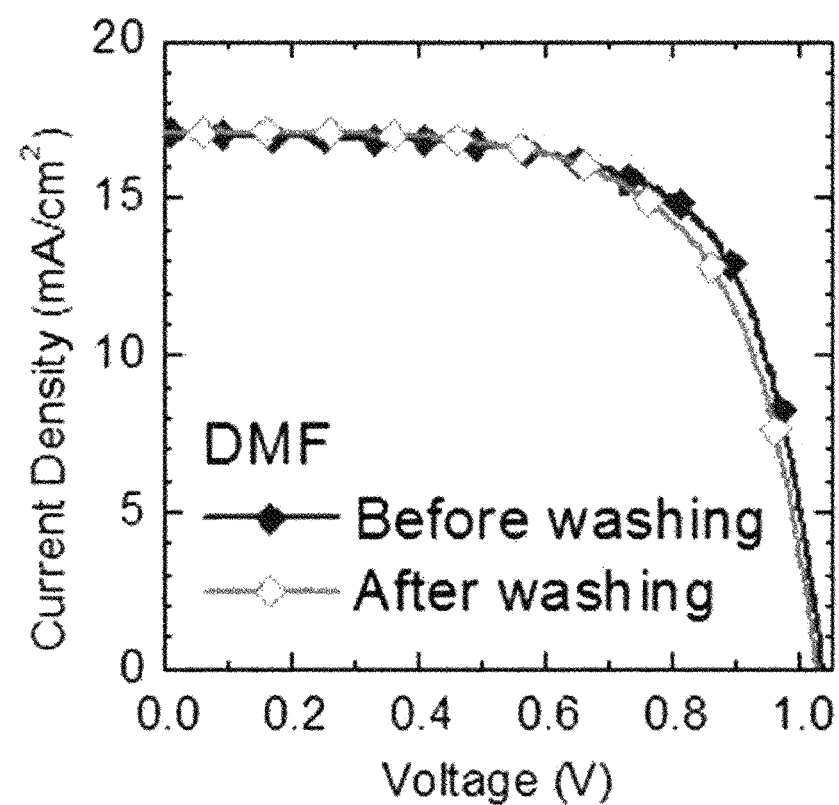

A perovskite solar cell was fabricated by forming a light absorbing layer, a hole transporting layer, and a metal electrode layer on the substrate recovered in Examples 1 to 3 in the same manner as in the preparation example. In order to check the energy conversion efficiency, the photocurrent-voltage characteristic was measured. At this time, the measurement was performed using a solar simulator under standard conditions of about 1.5 G of AM and 1 solar condition (100 mW/cm$^2$). As a result of the measurement, the photocurrent density (Jsc), the light voltage (Voc), the fill factor (FF) and the photoelectric conversion efficiency (PCE) were as shown in FIGS. 14 to 16. From the above results, it can be seen that various characteristics including the photoelectric conversion efficiency are improved.

The foregoing description of the present invention has been presented for purposes of illustration. It will be understood by those of ordinary skill in the art that various changes in form and details may be made therein without departing from the spirit and scope of the invention as defined by the appended claims. It is therefore to be understood that the above-described embodiments are illustrative in all aspects and not restrictive.

The scope of the present invention is defined by the appended claims rather than the detailed description, and all changes or modifications derived from the meaning and scope of the claims and their equivalents are to be construed as being included within the scope of the present invention.

The present invention improves the conventional process of discarding waste perovskite photoelectric conversion elements in a module form, by removing perovskite light absorbers, hole transporting layers, metal electrodes, and the like and collecting substrates to be used to reproduce photoelectric conversion elements having an initial high photoelectric conversion efficiency, thereby lowering the production cost.

What is claimed is:

1. A method for recycling a waste module of a perovskite photoelectric conversion element, comprising the step of immersing a waste module of a perovskite photoelectric conversion element in a washing solvent for a period of time satisfying Equation 1:

$$y=ax_1^{-b} \quad \text{[Equation 1]}$$

wherein y is the immersion time (min), $x_1$ is a dipole moment of the washing solvent, a is a constant of 700 to 850, and b is a constant of 4 to 6, wherein the dipole moment of the washing solvent is 1.5 or more, wherein the perovskite photoelectric conversion element comprises a transparent electrode layer, a hole blocking layer, an electron collecting layer, a light absorbing layer comprising an organometallic halide perovskite, a hole transporting layer, and a metal electrode layer sequentially attached on a transparent substrate, and wherein the light absorbing layer, the hole transporting layer, and the metal electrode layer are removed by immersing in the washing solvent.

2. A method for recycling a waste module of a perovskite photoelectric conversion element comprising the steps of:
adjusting a pH of a washing solvent; and
immersing a waste module of a perovskite photoelectric conversion element in the washing solvent for a period of time satisfying Equation 2 in relation to the pH of the washing solvent:

$$y=[[ce^{dx_2}]c\cdot\exp(dx_2) \quad \text{[Equation 2]}$$

wherein y is the immersion time (min), $x_2$ is the pH of the washing solvent, c is a constant of 40 to 50 and d is a constant of about 0.3 to 0.9.

3. The method for recycling a waste module of a perovskite photoelectric conversion element according to claim 2, wherein the waste module has a light absorbing layer containing an organometallic halide, and the washing solvent is capable of $S_N2$ reaction with the organometallic halide.

4. The method for recycling a waste module of a perovskite photoelectric conversion element according to claim 3, wherein the perovskite photoelectric conversion element has a transparent electrode layer, a hole blocking layer, an electron collecting layer, a light absorbing layer, a hole transporting layer, and a metal electrode layer sequentially formed on a transparent substrate.

5. The method for recycling a waste module of a perovskite photoelectric conversion element according to claim 4, wherein the light absorbing layer, the hole transporting layer, the metal electrode layer or a combination thereof is removed by immersing in the washing solvent, and further comprising recycling a substructure having the transparent electrode layer and the electron collecting layer.

6. The method for recycling a waste module of a perovskite photoelectric conversion element according to claim 5, further comprising a step of forming a light absorbing layer, a hole transporting layer, a metal electrode layer or a combination thereof on the recycled substructure.

7. The method for recycling a waste module of a perovskite photoelectric conversion element according to claim 2, wherein the washing solvent comprises water.

8. The method for recycling a waste module of a perovskite photoelectric conversion element according to claim 2, wherein the washing solvent comprises alcohol.

9. The method for recycling a waste module of a perovskite photoelectric conversion element according to claim 1, wherein the washing solvent is capable of $S_N2$ reaction with the organometallic perovskite halide.

10. The method for recycling a waste module of a perovskite photoelectric conversion element according to claim 1, further comprising recycling a substructure having the transparent electrode layer and the electron collecting layer.

11. The method for recycling a waste module of a perovskite photoelectric conversion element according to claim 10, further comprising a step of forming a light absorbing layer, a hole transporting layer, a metal electrode layer or a combination thereof on the recycled substructure.

12. The method for recycling a waste module of a perovskite photoelectric conversion element according to claim 11, wherein the perovskite photoelectric conversion element is a perovskite solar cell.

13. The method for recycling a waste module of a perovskite photoelectric conversion element according to claim 1, wherein the hole transporting layer comprises spiro-MeOTAD or P3HT and a p-type dopant.

14. The method for recycling a waste module of a perovskite photoelectric conversion element according to claim 1, wherein the organometallic halide perovskite comprises Pb.

15. The method for recycling a waste module of a perovskite photoelectric conversion element according to claim 1, wherein the electron collecting layer comprises a metal oxide.

* * * * *